(12) United States Patent
Choi et al.

(10) Patent No.: US 9,601,462 B2
(45) Date of Patent: Mar. 21, 2017

(54) SEMICONDUCTOR DEVICE AND METHOD OF FORMING UBM STRUCTURE ON BACK SURFACE OF TSV SEMICONDUCTOR WAFER

(71) Applicant: STATS ChipPAC, Ltd., Singapore (SG)

(72) Inventors: Won Kyoung Choi, Singapore (SG); Chang Beom Yong, Singapore (SG); Jae Hun Ku, Singapore (SG)

(73) Assignee: STATS ChipPAC Pte. Ltd., Singapore (SG)

( * ) Notice: Subject to any disclaimer, the term of this patent is extended or adjusted under 35 U.S.C. 154(b) by 3 days.

(21) Appl. No.: 14/288,589

(22) Filed: May 28, 2014

(65) Prior Publication Data
US 2014/0264851 A1  Sep. 18, 2014

Related U.S. Application Data

(62) Division of application No. 13/324,446, filed on Dec. 13, 2011, now Pat. No. 8,809,191.

(51) Int. Cl.
*H01L 25/00* (2006.01)
*H01L 25/065* (2006.01)
(Continued)

(52) U.S. Cl.
CPC ...... *H01L 25/0657* (2013.01); *H01L 21/6836* (2013.01); *H01L 21/76898* (2013.01); *H01L 24/11* (2013.01); *H01L 24/14* (2013.01); *H01L 24/13* (2013.01); *H01L 24/16* (2013.01); *H01L 2221/6834* (2013.01); *H01L 2224/05572* (2013.01); *H01L 2224/11002* (2013.01); *H01L 2224/1145* (2013.01); *H01L 2224/1146* (2013.01); *H01L 2224/11849* (2013.01); *H01L 2224/11901* (2013.01); *H01L 2224/13025* (2013.01); *H01L 2224/13111* (2013.01);
(Continued)

(58) Field of Classification Search
None
See application file for complete search history.

(56) References Cited

U.S. PATENT DOCUMENTS 5,444,022 A * 8/1995 Gardner ............... 438/627
5,618,752 A   4/1997 Gaul
(Continued)

*Primary Examiner* — Evren Seven
(74) *Attorney, Agent, or Firm* — Robert D. Atkins; Patent Law Group: Atkins and Associates, P.C.

(57) ABSTRACT

A semiconductor device has a plurality of conductive vias formed through the semiconductor die with a first insulating layer around the conductive vias. A recess is formed in the first insulating layer around the conductive vias by LDA. A portion of the semiconductor wafer is removed by LDA after forming the recess in the first insulating layer so that the conductive vias extend above a surface of the semiconductor wafer. The first insulating layer extends to the surface of the semiconductor wafer or above the surface of the semiconductor wafer. A second insulating layer is formed over the surface of the semiconductor wafer and conductive vias. A first portion of the second insulating layer is removed by LDA, while leaving a second portion of the second insulating layer over the surface of the semiconductor wafer around the conductive vias. An electroless plated bump is formed over the conductive vias.

22 Claims, 18 Drawing Sheets

(51) Int. Cl.
*H01L 21/768* (2006.01)
*H01L 23/00* (2006.01)
*H01L 21/683* (2006.01)

(52) U.S. Cl.
CPC ............. *H01L 2224/13113* (2013.01); *H01L 2224/13124* (2013.01); *H01L 2224/13139* (2013.01); *H01L 2224/13144* (2013.01); *H01L 2224/13147* (2013.01); *H01L 2224/13155* (2013.01); *H01L 2224/1403* (2013.01); *H01L 2224/14131* (2013.01); *H01L 2224/14181* (2013.01); *H01L 2224/16148* (2013.01); *H01L 2224/48091* (2013.01); *H01L 2224/73204* (2013.01); *H01L 2224/73265* (2013.01); *H01L 2224/94* (2013.01); *H01L 2924/15311* (2013.01)

(56) References Cited

U.S. PATENT DOCUMENTS

| | | | |
|---|---|---|---|
| 6,664,174 B2 | 12/2003 | Ema et al. | |
| 6,809,421 B1 * | 10/2004 | Hayasaka et al. | ............ 257/777 |
| 7,214,615 B2 | 5/2007 | Miyazawa | |
| 7,531,453 B2 | 5/2009 | Kirby et al. | |
| 7,589,008 B2 | 9/2009 | Kirby | |
| 7,863,189 B2 | 1/2011 | Basker et al. | |
| 7,973,411 B2 * | 7/2011 | Borthakur | ............ 257/762 |
| 8,138,017 B2 * | 3/2012 | Chin | ............ 438/107 |
| 8,525,168 B2 * | 9/2013 | Dang et al. | ............ 257/48 |
| 2006/0205211 A1 | 9/2006 | Kirby | |
| 2010/0038800 A1 | 2/2010 | Yoon et al. | |
| 2010/0230759 A1 | 9/2010 | Yang et al. | |
| 2010/0237504 A1 | 9/2010 | Hong et al. | |
| 2011/0057326 A1 * | 3/2011 | Kai | ............ H01L 21/31116 257/774 |
| 2011/0133333 A1 | 6/2011 | Kwon et al. | |
| 2012/0133010 A1 | 5/2012 | Komukai | |
| 2012/0153492 A1 * | 6/2012 | Bachman et al. | ............ 257/774 |
| 2012/0235305 A1 | 9/2012 | Kim et al. | |
| 2012/0238091 A1 * | 9/2012 | Hsieh | ............ H01L 21/76898 438/653 |
| 2012/0292782 A1 | 11/2012 | Lee et al. | |
| 2013/0234341 A1 * | 9/2013 | Onai | ............ 257/774 |

* cited by examiner

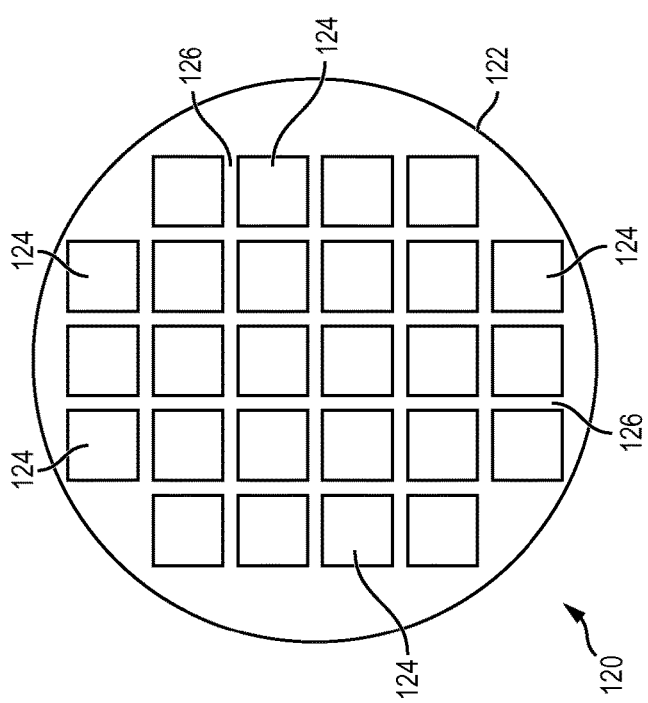
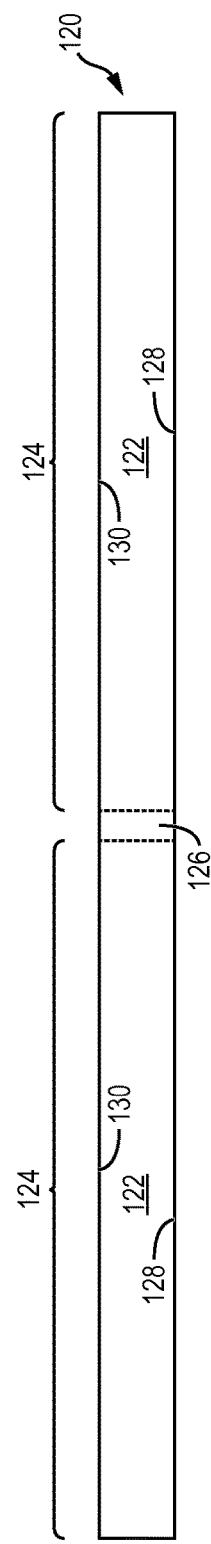

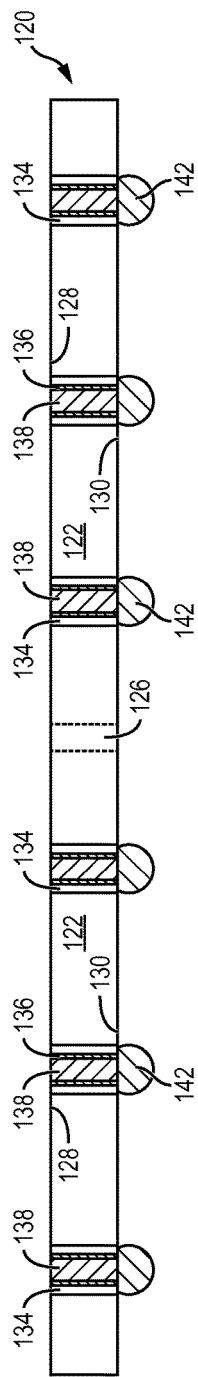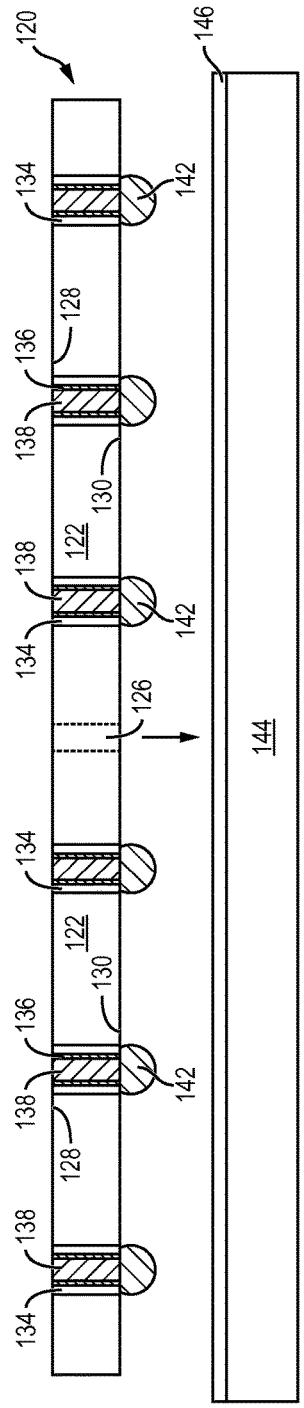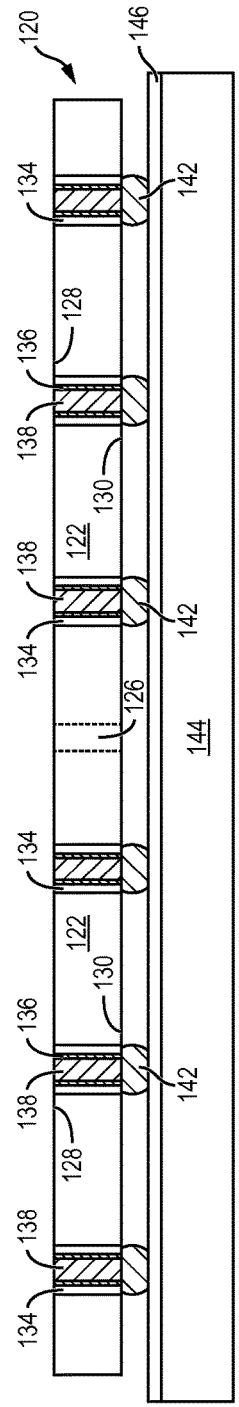

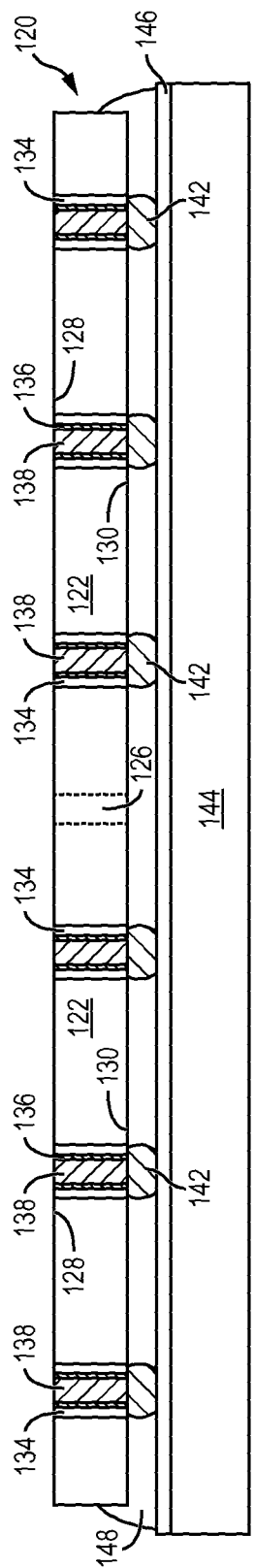
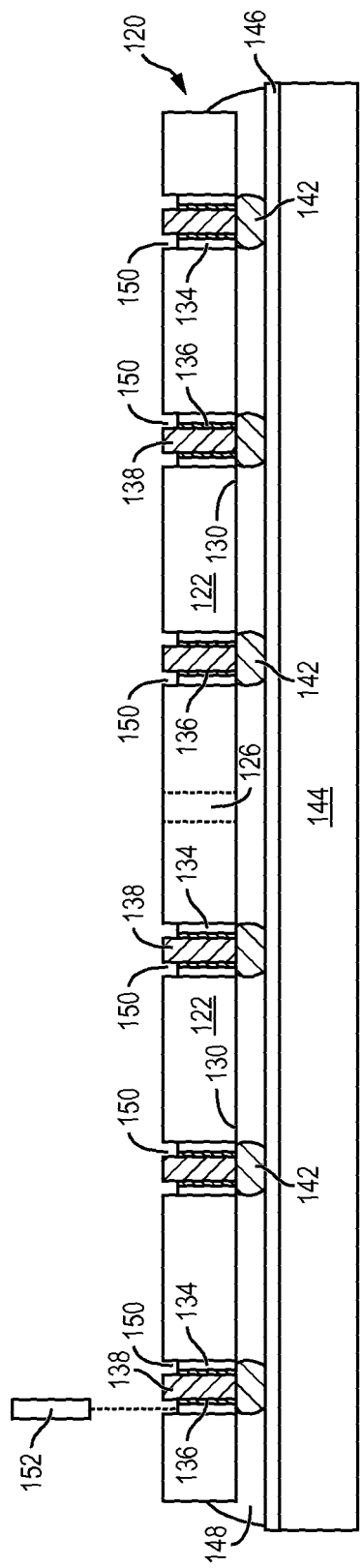
FIG. 3i
FIG. 3j

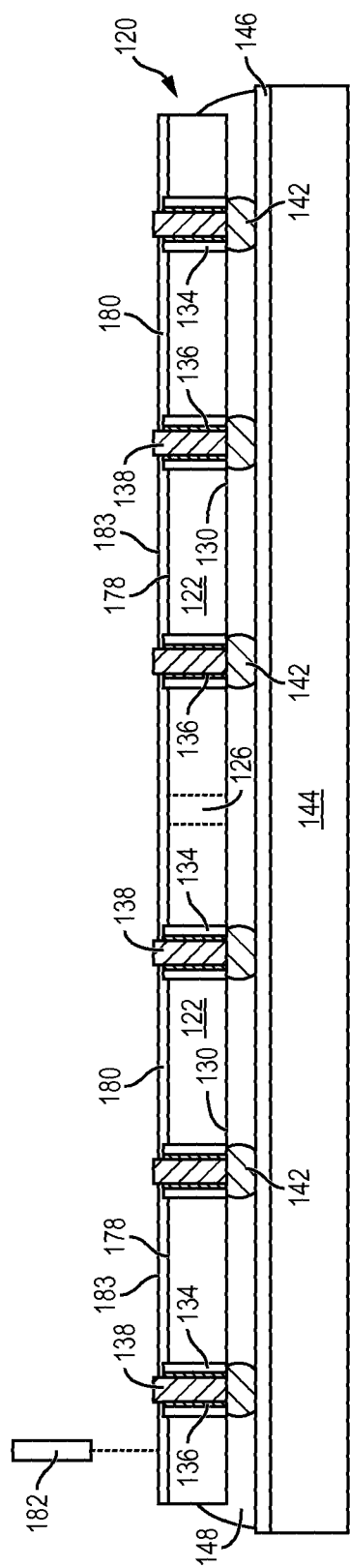
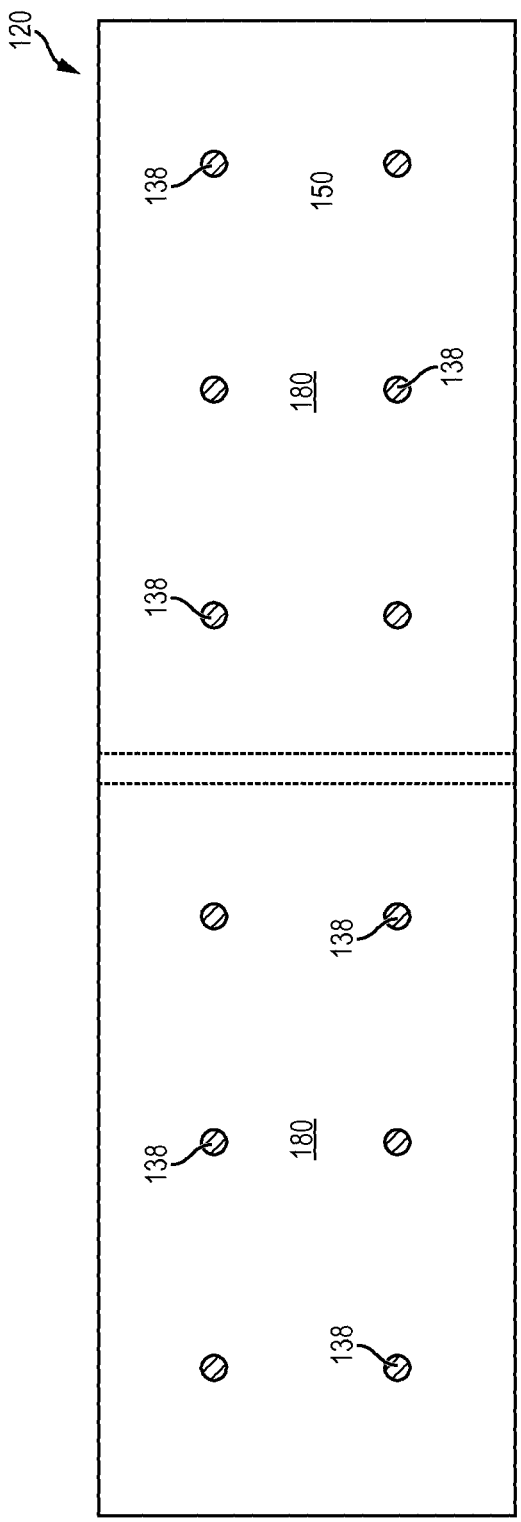

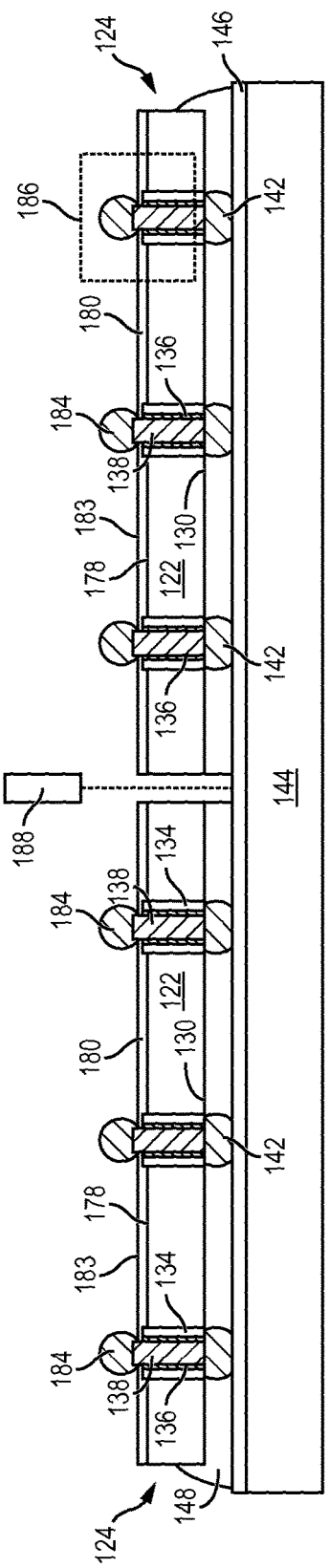
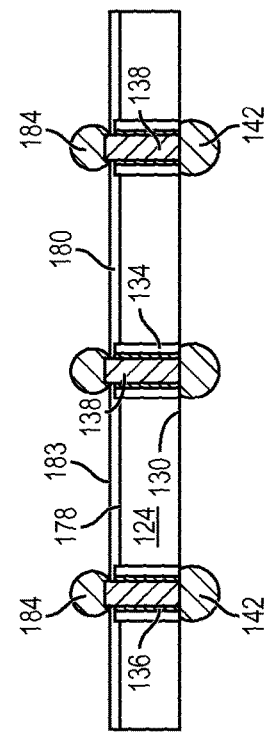
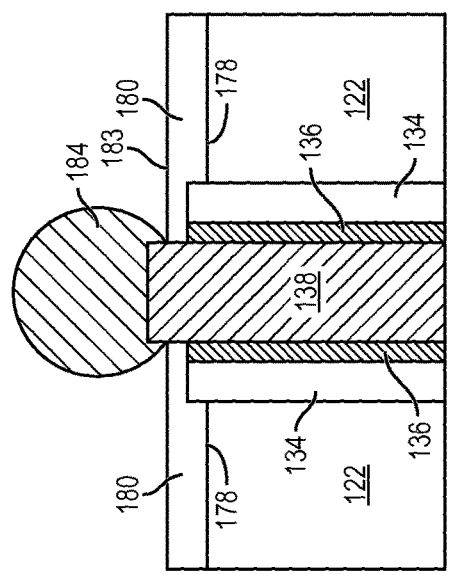

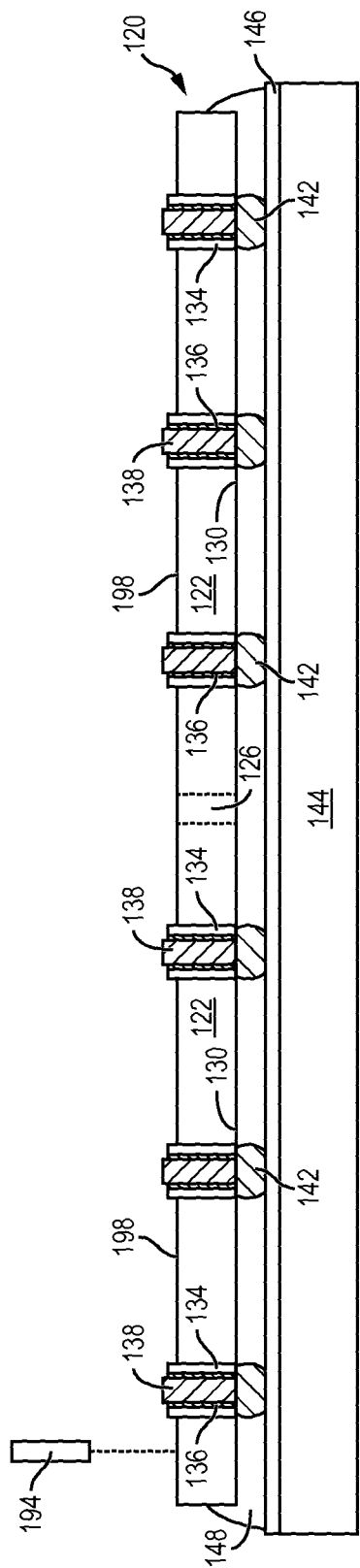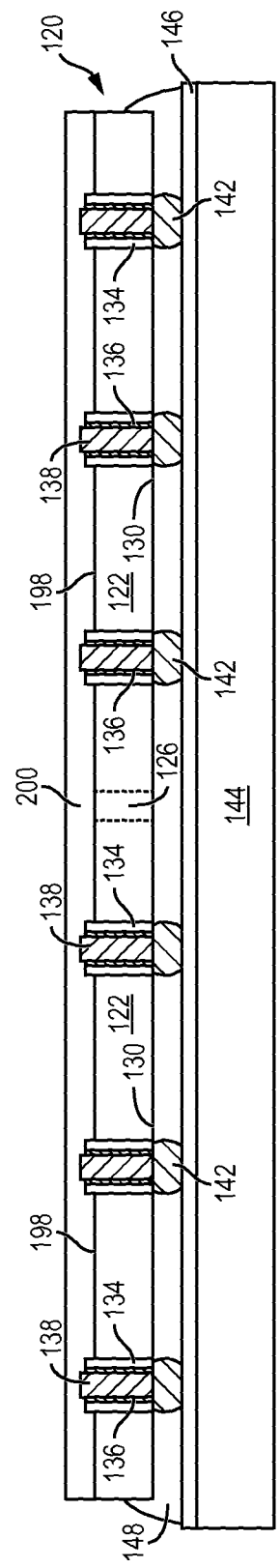
FIG. 8c
FIG. 8d

SEMICONDUCTOR DEVICE AND METHOD OF FORMING UBM STRUCTURE ON BACK SURFACE OF TSV SEMICONDUCTOR WAFER

CLAIM TO DOMESTIC PRIORITY

The present application is a division of U.S. patent application Ser. No. 13/324,446, now U.S. Pat. No. 8,809, 191, filed Dec. 13, 2011, which application is incorporated herein by reference.

FIELD OF THE INVENTION

The present invention relates in general to semiconductor devices and, more particularly, to a semiconductor device and method of forming a UBM structure on a back surface of a TSV semiconductor wafer.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each semiconductor die is typically identical and contains circuits formed by electrically connecting active and passive components. Back-end manufacturing involves singulating individual semiconductor die from the finished wafer and packaging the die to provide structural support and environmental isolation. The term "semiconductor die" as used herein refers to both the singular and plural form of the words, and accordingly can refer to both a single semiconductor device and multiple semiconductor devices.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller semiconductor die size can be achieved by improvements in the front-end process resulting in semiconductor die with smaller, higher density active and passive components. Back-end processes may result in semiconductor device packages with a smaller footprint by improvements in electrical interconnection and packaging materials.

A conventional semiconductor wafer may contain conductive through silicon vias (TSV). A plurality of vias is formed through the semiconductor wafer. An insulating layer can be formed on the sidewall of the vias. The vias are filled with conductive material to form the conductive TSV. A portion of the back surface of the semiconductor wafer is removed by chemical mechanical polishing (CMP) or etching process to expose the conductive TSV. The insulating layer around the conductive TSV is subject to cracking or breakage due to thermal stress that can lead to undesired current leakage from the conductive TSV into base substrate material. In addition, the insulating layer limits the contact area and adhesion for electroless plating of interconnect bumps to primarily just the upper surface of the TSV. A weak adhesion between the bumps and conductive TSV reduces joint reliability.

SUMMARY OF THE INVENTION

A need exists for a reliable joint between a conductive TSV and interconnect bump on a back surface of a semiconductor wafer. Accordingly, in one embodiment, the present invention is a semiconductor device comprising a semiconductor die and conductive via formed through the semiconductor die. A first insulating layer is formed around the conductive via extending at least to a first surface of the semiconductor die. A second insulating layer is formed over the first surface of the semiconductor die. The conductive via extends above the first insulating layer and second insulating layer.

In another embodiment, the present invention is a semiconductor device comprising a substrate and conductive via formed through the substrate. A first insulating layer is formed around the conductive via. A second insulating layer is formed over a first surface of the substrate. The conductive via extends above the first insulating layer.

In another embodiment, the present invention is a semiconductor device comprising a substrate and conductive via formed through the substrate. A first insulating layer is formed around the conductive via. The conductive via extends above a first surface of the substrate.

In another embodiment, the present invention is a semiconductor device comprising a substrate and conductive via formed through the substrate. A first insulating layer is formed over a first surface of the substrate. The conductive via extends above the first insulating layer.

BRIEF DESCRIPTION OF THE DRAWINGS

FIGS. 6a-6h illustrate another process of forming a UBM structure on a back surface of a TSV semiconductor wafer;

FIG. 7 illustrates a semiconductor die with the UBM structure formed on a back surface of the die according to FIGS. 6a-6h;

FIGS. 8a-8h illustrate another process of forming a UBM structure on a back surface of a TSV semiconductor wafer.

DETAILED DESCRIPTION OF THE DRAWINGS

Figure 1:
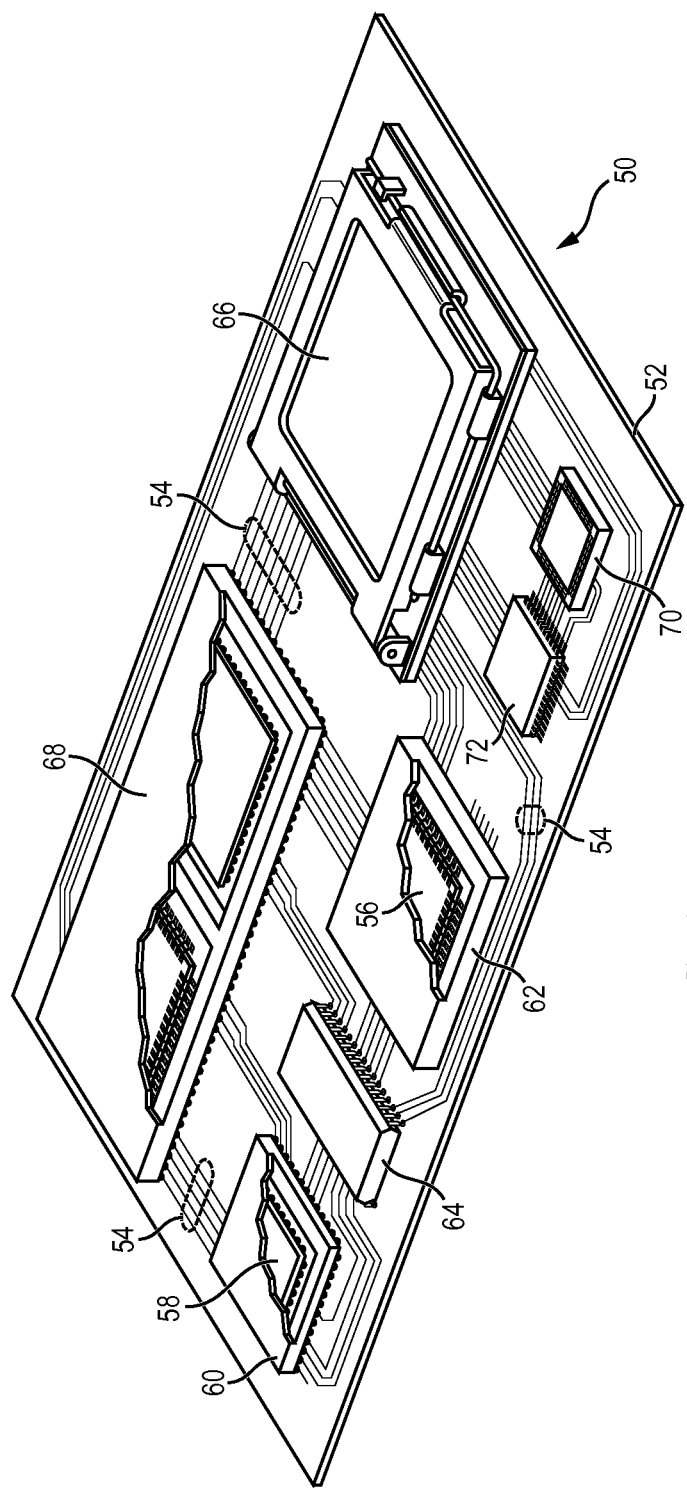
FIG. 1 illustrates a printed circuit board (PCB) with different types of packages mounted to its surface.

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition can involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. In one embodiment, the portion of the photoresist pattern subjected to light is removed using a solvent, exposing portions of the underlying layer to be patterned. In another embodiment, the portion of the photoresist pattern not subjected to light, i.e., the negative photoresist, is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Patterning is the basic operation by which portions of the top layers on the semiconductor wafer surface are removed. Portions of the semiconductor wafer can be removed using photolithography, photomasking, masking, oxide or metal removal, photography and stenciling, and microlithography. Photolithography includes forming a pattern in reticles or a photomask and transferring the pattern into the surface layers of the semiconductor wafer. Photolithography forms the horizontal dimensions of active and passive components on the surface of the semiconductor wafer in a two-step process. First, the pattern on the reticle or masks is transferred into a layer of photoresist. Photoresist is a light-sensitive material that undergoes changes in structure and properties when exposed to light. The process of changing the structure and properties of the photoresist occurs as either negative-acting photoresist or positive-acting photoresist. Second, the photoresist layer is transferred into the wafer surface. The transfer occurs when etching removes the portion of the top layers of semiconductor wafer not covered by the photoresist. The chemistry of photoresists is such that the photoresist remains substantially intact and resists removal by chemical etching solutions while the portion of the top layers of the semiconductor wafer not covered by the photoresist is removed. The process of forming, exposing, and removing the photoresist, as well as the process of removing a portion of the semiconductor wafer can be modified according to the particular resist used and the desired results.

In negative-acting photoresists, photoresist is exposed to light and is changed from a soluble condition to an insoluble condition in a process known as polymerization. In polymerization, unpolymerized material is exposed to a light or energy source and polymers form a cross-linked material that is etch-resistant. In most negative resists, the polymers are polyisopremes. Removing the soluble portions (i.e., the portions not exposed to light) with chemical solvents or developers leaves a hole in the resist layer that corresponds to the opaque pattern on the reticle. A mask whose pattern exists in the opaque regions is called a clear-field mask.

In positive-acting photoresists, photoresist is exposed to light and is changed from relatively nonsoluble condition to much more soluble condition in a process known as photosolubilization. In photosolubilization, the relatively insoluble resist is exposed to the proper light energy and is converted to a more soluble state. The photosolubilized part of the resist can be removed by a solvent in the development process. The basic positive photoresist polymer is the phenol-formaldehyde polymer, also called the phenol-formaldehyde novolak resin. Removing the soluble portions (i.e., the portions exposed to light) with chemical solvents or developers leaves a hole in the resist layer that corresponds to the transparent pattern on the reticle. A mask whose pattern exists in the transparent regions is called a dark-field mask.

After removal of the top portion of the semiconductor wafer not covered by the photoresist, the remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual semiconductor die and then packaging the semiconductor die for structural support and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 50 having a chip carrier substrate or printed circuit board (PCB) 52 with a plurality of semiconductor packages mounted on its surface. Electronic device 50 can have one type of semiconductor package, or multiple types of semiconductor packages, depending on the application. The different types of semiconductor packages are shown in FIG. 1 for purposes of illustration.

Electronic device 50 can be a stand-alone system that uses the semiconductor packages to perform one or more electrical functions. Alternatively, electronic device 50 can be a subcomponent of a larger system. For example, electronic device 50 can be part of a cellular phone, personal digital assistant (PDA), digital video camera (DVC), or other electronic communication device. Alternatively, electronic device 50 can be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components. Miniaturization and weight reduction are essential for these products to be accepted by the market. The distance between semiconductor devices must be decreased to achieve higher density.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including bond wire package 56 and flipchip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using less expensive components and a streamlined manufacturing process. The resulting devices are less likely to fail and less expensive to manufacture resulting in a lower cost for consumers.

Figure 2A:
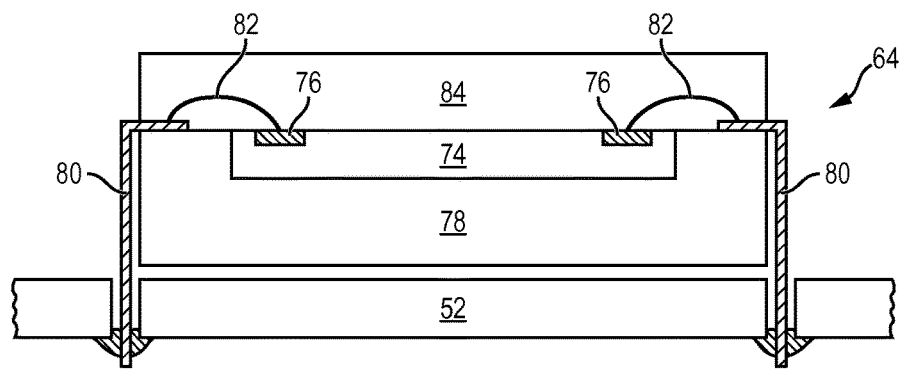
FIGS. 2a-2c illustrate further detail of the representative semiconductor packages mounted to the PCB.
Figure 2B:
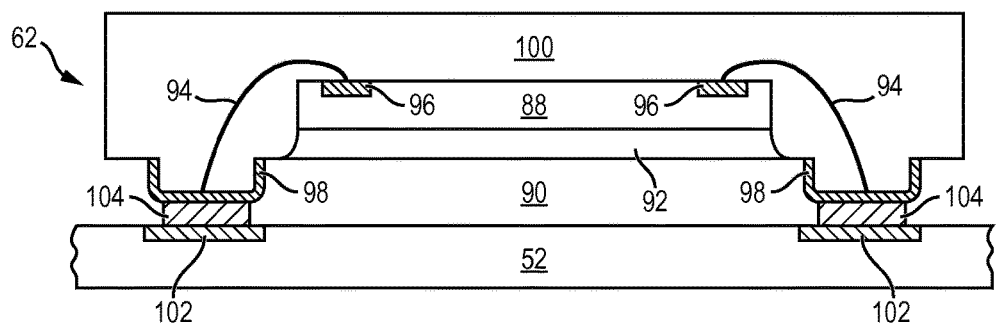
Figure 2C:
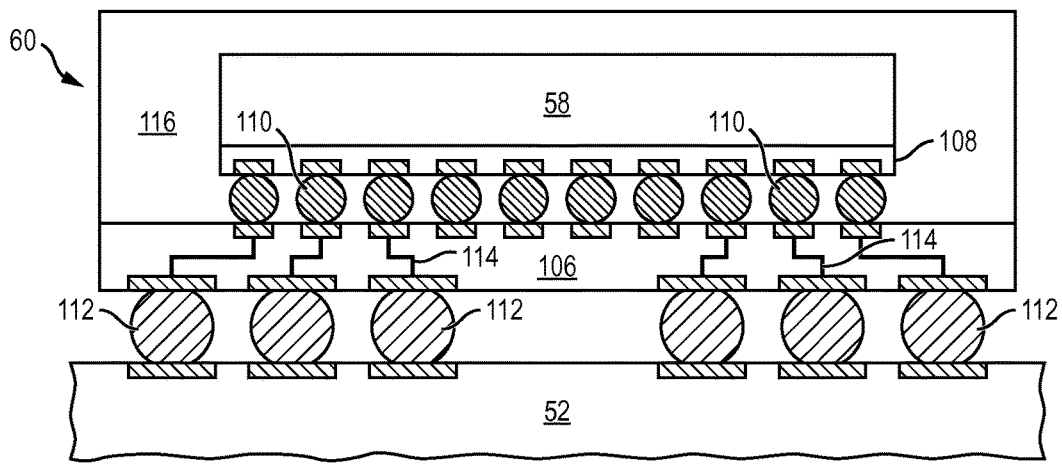

FIGS. 2a-2c show exemplary semiconductor packages. FIG. 2a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit can include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy or epoxy resin. The package body includes an insulative packaging material such as polymer or ceramic. Conductor leads 80 and bond wires 82 provide electrical interconnect between semiconductor die 74 and PCB 52. Encapsulant 84 is deposited over the package for environmental protection by preventing moisture and particles from entering the package and contaminating semiconductor die 74 or bond wires 82.

FIG. 2b illustrates further detail of BCC 62 mounted on PCB 52. Semiconductor die 88 is mounted over carrier 90 using an underfill or epoxy-resin adhesive material 92. Bond wires 94 provide first level packaging interconnect between contact pads 96 and 98. Molding compound or encapsulant 100 is deposited over semiconductor die 88 and bond wires 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 2c, semiconductor die 58 is mounted face down to intermediate carrier 106 with a flipchip style first level packaging. Active region 108 of semiconductor die 58 contains analog or digital circuits implemented as active devices, passive devices, conductive layers, and dielectric layers formed according to the electrical design of the die. For example, the circuit can include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flipchip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flipchip style first level packaging without intermediate carrier 106.

Figure 3C:
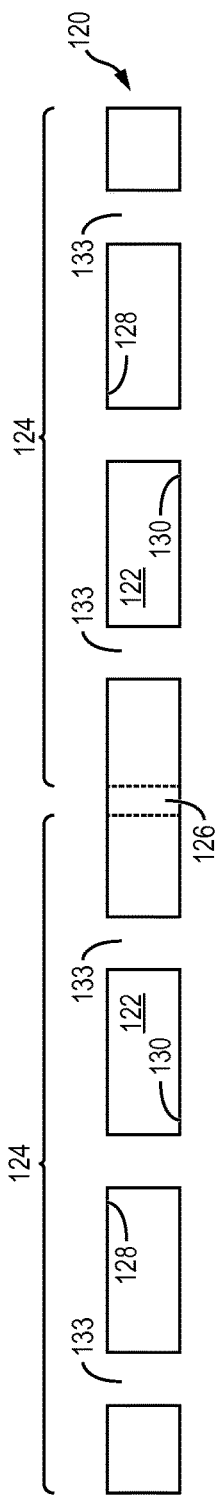
FIGS. 3a-3q illustrate a process of forming a UBM structure on a back surface of a TSV semiconductor wafer.
Figure 3D:
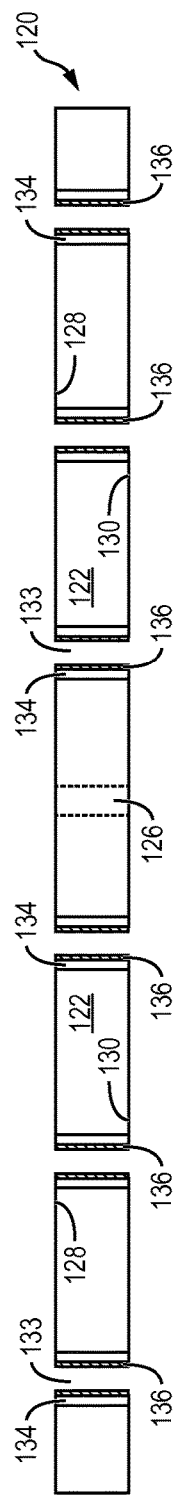
Figure 3E:
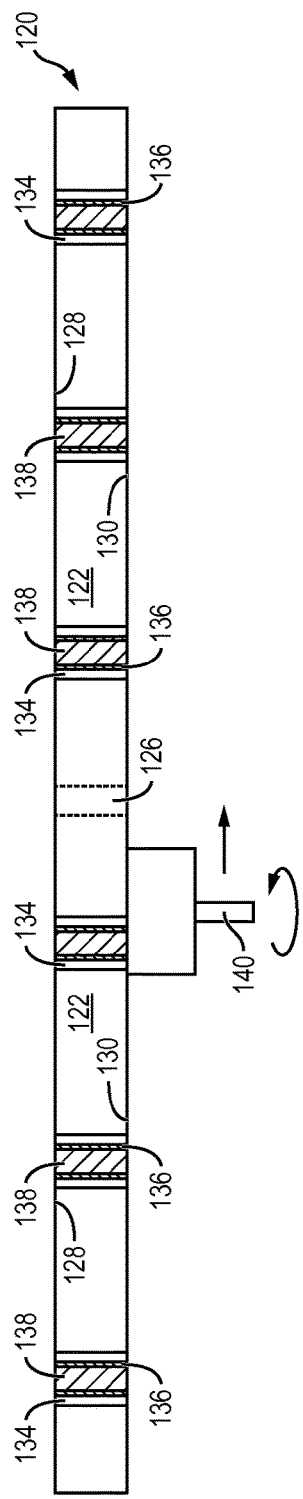
Figure 3K:
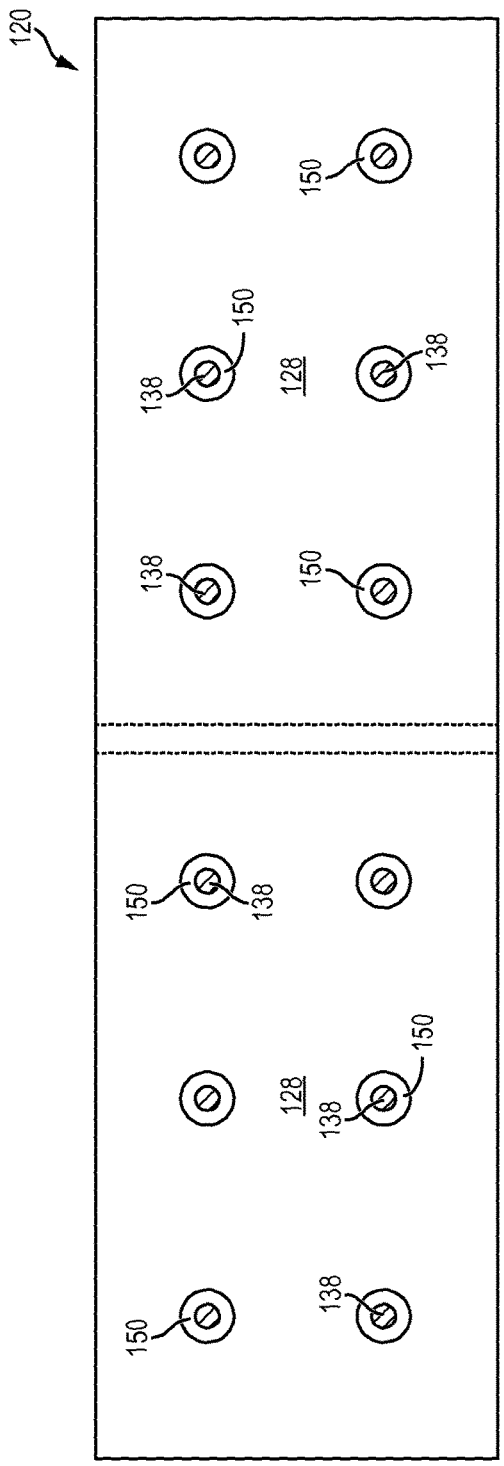
Figure 3L:
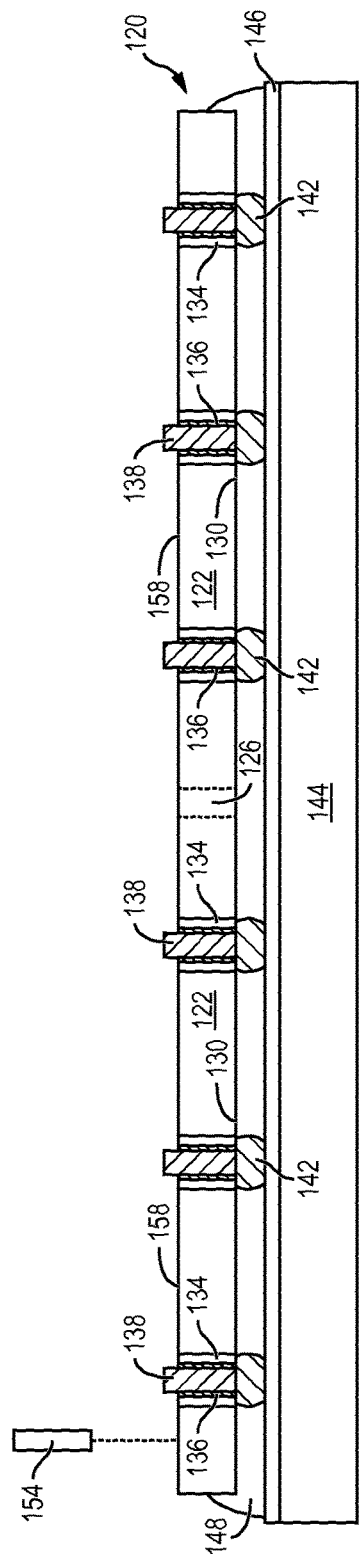
Figure 3M:
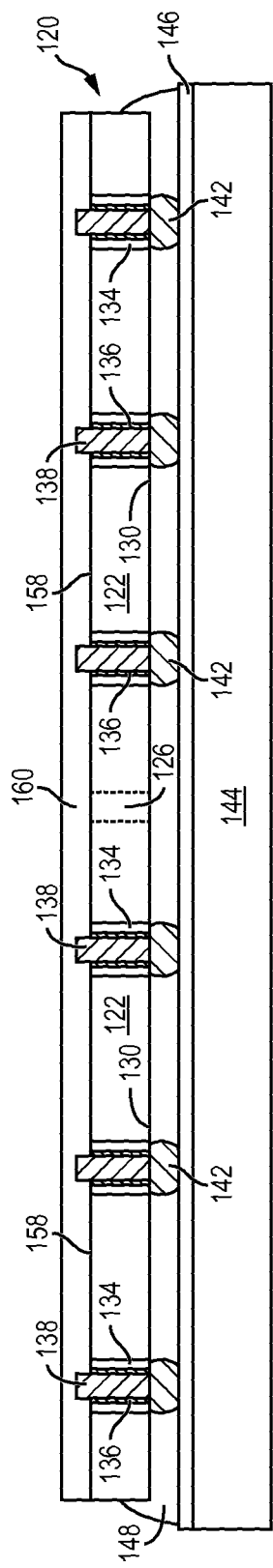
Figure 3N:
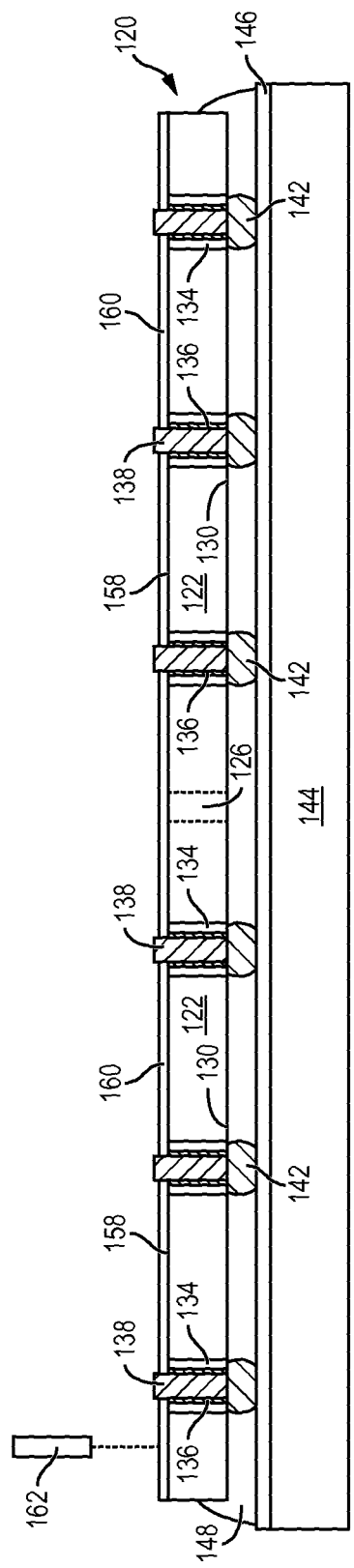
Figure 3O:
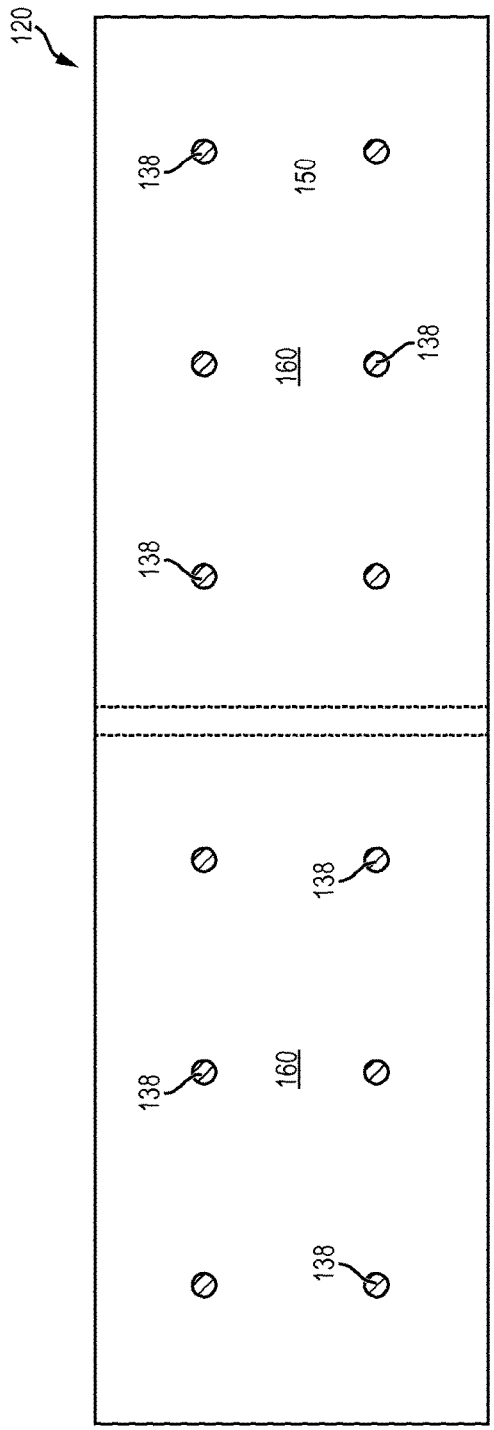
Figure 3P:
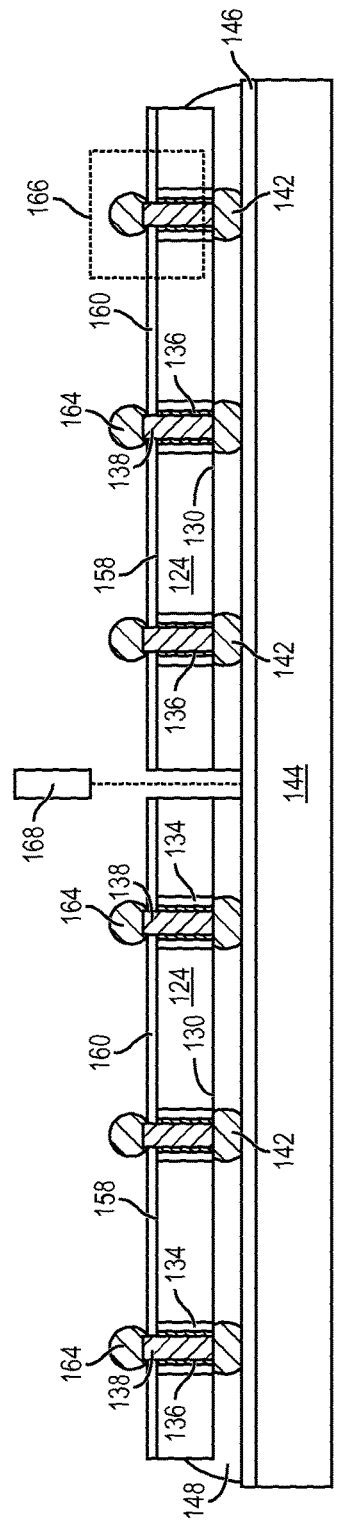
Figure 3Q:
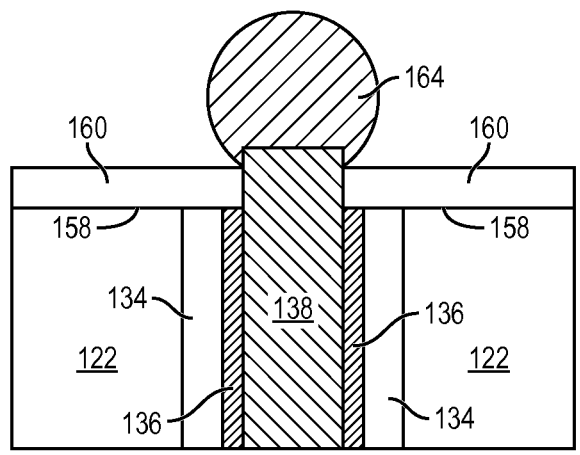

FIGS. 3a-3q illustrate, in relation to FIGS. 1 and 2a-2c, a process of forming a UBM structure on a back surface of a TSV semiconductor wafer. FIG. 3a shows a semiconductor wafer 120 with a base substrate material 122, such as silicon, germanium, gallium arsenide, indium phosphide, or silicon carbide, for structural support. A plurality of semiconductor die or components 124 is formed on wafer 120 separated by a non-active, inter-die wafer area or saw street 126 as described above. Saw street 126 provides cutting areas to singulate semiconductor wafer 120 into individual semiconductor die 124.

FIG. 3b shows a cross-sectional view of a portion of semiconductor wafer 120. Each semiconductor die 124 has a back surface 128 and active surface 130 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 130 to implement analog circuits or digital circuits, such as digital signal processor (DSP), ASIC, memory, or other signal processing circuit. Semiconductor die 124 may also contain integrated passive devices (IPDs), such as inductors, capacitors, and resistors, for RF signal processing.

In FIG. 3c, semiconductor wafer 120 is inverted. A plurality of vias 133 is formed into back surface 128 and through semiconductor wafer 120 using mechanical drilling, laser drilling, or deep reactive ion etching (DRIE).

In FIG. 3d, an insulating or dielectric layer 134 is formed over sidewalls of vias 133 using PVD, CVD, printing, spin coating, spray coating, sintering or thermal oxidation. The insulating layer 134 contains one or more layers of silicon dioxide (SiO2), silicon nitride (Si3N4), silicon oxynitride (SiON), tantalum pentoxide (Ta2O5), aluminum oxide (Al2O3), hafnium oxide (HfO2), benzocyclobutene (BCB), polyimide (PI), polybenzoxazoles (PBO), or other suitable dielectric material.

An electrically conductive layer 136 is formed over insulating layer 134 within vias 133 using a patterning and metal deposition process such as printing, PVD, CVD, sputtering, electrolytic plating, and electroless plating. Conductive layer 136 can be one or more layers of Ni, tantalum nitride (TaN), nickel vanadium (NiV), platinum (Pt), palladium (Pd), chromium copper (CrCu), or other suitable barrier material.

In FIG. 3e, vias 133 are filled with Al, Cu, Sn, Ni, Au, Ag, titanium (Ti), tungsten (W), poly-silicon, or other suitable electrically conductive material using electrolytic plating, electroless plating process, or other suitable metal deposition process to form z-direction conductive TSV 138 lined with insulating layer 134 and conductive layer 136 and embedded within semiconductor wafer 120. In one embodiment, conductive layer 136 operates as a barrier layer to inhibit diffusion of conductive TSV 138, e.g. Cu, into insulating layer 134 and base substrate material 122. Conductive TSV 138 are electrically connected to the circuits on active surface 130. A portion of active surface 130 of semiconductor die 124 is removed by grinder 140 or CMP to planarize the surface and expose conductive TSV 138. A CMP process can also be used to planarize back surface 128 and expose conductive TSV 138.

In FIG. 3f, an electrically conductive bump material is deposited over conductive TSV 138 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive TSV 138 using a suitable attachment or bonding process. In one embodiment, the bump material is reflowed by heating the material above its melting point to form spherical balls or bumps 142. In some applications, bumps 142 are reflowed a second time to improve electrical contact to conductive TSV 138. An optional under bump metallization (UBM) layer can be disposed between bumps 142 and conductive TSV 138. Bumps 142 can also be compression bonded to conductive TSV 138. Bumps 142 represent one type of interconnect structure that can be formed over conductive TSV 138. The interconnect structure can also use stud bump, micro bump, or other electrical interconnect.

FIG. 3g shows a temporary substrate or carrier 144 containing sacrificial base material such as silicon, polymer, beryllium oxide, glass, or other suitable low-cost, rigid material for structural support. An interface layer or double-sided tape 146 is formed over carrier 144 as a temporary adhesive bonding film, etch-stop layer, or thermal release layer. Semiconductor wafer 120 is positioned over and mounted to interface layer 146 over carrier 144 with active surface 130 oriented toward the carrier. FIG. 3h shows semiconductor wafer 120 mounted to interface layer 146 over carrier 144.

Semiconductor wafer 120 and carrier 144 are placed in a chase mold. A mold underfill (MUF) material 148 in a liquid state is injected into the chase mold between semiconductor wafer 120 and carrier 144. MUF material 148 can be an encapsulant, molding compound, or polymer composite material, such as epoxy resin with filler, epoxy acrylate with filler, or polymer with proper filler. MUF material 148 is cured. FIG. 3i shows MUF material 148 disposed between semiconductor wafer 120 and carrier 144.

In FIG. 3j, a portion of insulating layer 134 and conductive layer 136 around conductive TSV 138 is removed by an etching process through a patterned photoresist layer to form recesses 150 into base substrate material 122. Alternatively, recesses 150 are formed by laser direct ablation (LDA) using laser 152. In one embodiment, the depth of recesses 150 is 1-20 micrometers (μm). FIG. 3k shows a plan view of back surface 128 of semiconductor die 124 and recesses 150 formed around conductive TSV 138.

After forming recesses 150, a portion of back surface 128 of semiconductor wafer 120 is removed by an etching process through a patterned photoresist layer, as shown in FIG. 3l. Alternatively, a portion of back surface 128 of semiconductor wafer 120 is removed by LDA using laser 154. In one embodiment, the amount of base substrate material 122 removed is substantially equal to the depth of recesses 150. Forming recesses 150 prior to removing a portion of back surface 128 allows for process control and precision during removal of insulating layer 134 and reduces cracking of the insulating layer due to thermal stress. After removing a portion of back surface 128, conductive TSV 138 extends above surface 158 of semiconductor wafer 120.

In FIG. 3m, an insulating or dielectric layer 160 is blanket formed over surface 158 of semiconductor wafer 120, insulating layer 134, conductive layer 136, and conductive TSV 138 using PVD, CVD, printing, spin coating, or spray coating. The insulating layer 160 contains one or more layers of SiO2, Si3N4, SiON, Ta2O5, Al2O3, HfO2, PI, BCB, PBO, or other material having similar dielectric properties.

In FIG. 3n, a portion of insulating layer 160 is removed by an etching process to expose an upper surface and a portion of sidewalls of conductive TSV 138, while leaving a layer of insulating layer 160 over surface 158 of semiconductor wafer 120, insulating layer 134, and conductive layer 136. In another embodiment, a portion of insulating layer 160 is removed by LDA using laser 162 to expose an upper surface and a portion of sidewalls of conductive TSV 138, while leaving a layer of insulating layer 160 over surface 158 of semiconductor wafer 120, insulating layer 134, and conductive layer 136. The exposed and extended conductive TSV 138 operates as a UBM structure formed on a back surface of semiconductor wafer 120. FIG. 3o shows a plan view of the exposed and extended conductive TSV 138 surrounded by insulating layer 160.

In FIG. 3p, an electrically conductive bump material is deposited over the exposed conductive TSV 138 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive TSV 138 using a suitable attachment or bonding process. In one embodiment, the bump material is reflowed by heating the material above its melting point to form balls or bumps 164. In some applications, bumps 164 are reflowed a second time to improve electrical contact to conductive TSV 138. Bumps 164 can also be compression bonded to conductive TSV 138. Bumps 164 represent one type of interconnect structure that can be formed over conductive TSV 138. The interconnect structure can also use stud bump, micro bump, or other electrical interconnect.

FIG. 3q shows further detail of insulating layer 134, conductive layer 136, conductive TSV 138, and insulating layer 160 in block 166 defined in FIG. 3p. In particular, insulating layer 134 extends to surface 158 of semiconductor wafer 120. The exposed and extended conductive TSV 138 operates as a UBM structure formed on a back surface of semiconductor wafer 120. In one embodiment, bumps 164 are formed by electroless plating to an upper surface and side surfaces of conductive TSV 138 exposed and extending from insulating layer 160.

Semiconductor wafer 120 is singulated through insulating layer 160, saw street 126, and MUF material 148 using a saw blade or laser cutting tool 168 into individual semiconductor die 124. Carrier 144 and interface layer 146 are removed by chemical etching, mechanical peeling, CMP, mechanical grinding, thermal bake, UV light, laser scanning, or wet stripping to expose bumps 142.

Figure 4:
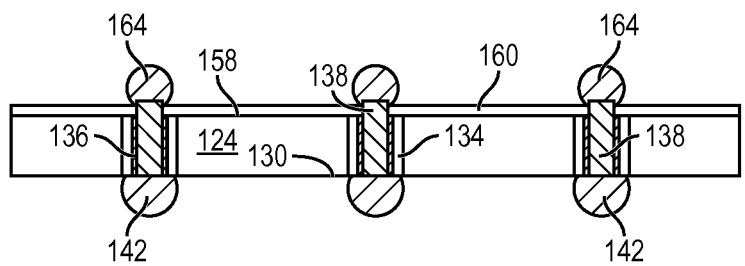
FIG. 4 illustrates a semiconductor die with the UBM structure formed on a back surface of the die according to FIGS. 3a-3q.

FIG. 4 shows semiconductor die 124 after singulation. The circuits on active surface 130 of semiconductor die 124 are electrically connected to conductive TSV 138, bumps 142 and bumps 164. A portion of insulating layer 134 and conductive layer 136 around conductive TSV 138 is removed to form recesses 150 into back surface 128 of semiconductor wafer 120. After forming recesses 150, a portion of back surface 128 is removed so that conductive TSV 138 extends above surface 158. Forming recesses 150 prior to removing a portion of back surface 128 provides process control and precision during removal of insulating layer 134 and reduces cracking of the insulating layer due to thermal stress. An insulating layer 160 is blanket formed over surface 158 of semiconductor wafer 120, insulating layer 134, conductive layer 136, and conductive TSV 138. A portion of insulating layer 160 is removed to expose an upper surface and a portion of the sidewalls of conductive TSV 138, while leaving a layer of insulating layer 160 over surface 158 of semiconductor wafer 120, insulating layer 134, and conductive layer 136. Bumps 164 are formed over the exposed and extended conductive TSV 138 by electroless plating. No masking layer is required for electroless plating of bumps 164 over the exposed and extended conductive TSV 138. The extended conductive TSV 138 provides greater contact area with bumps 164, namely contact with the exposed upper surface and sidewalls of the conductive TSV for a high reliability interconnect.

Figure 5:
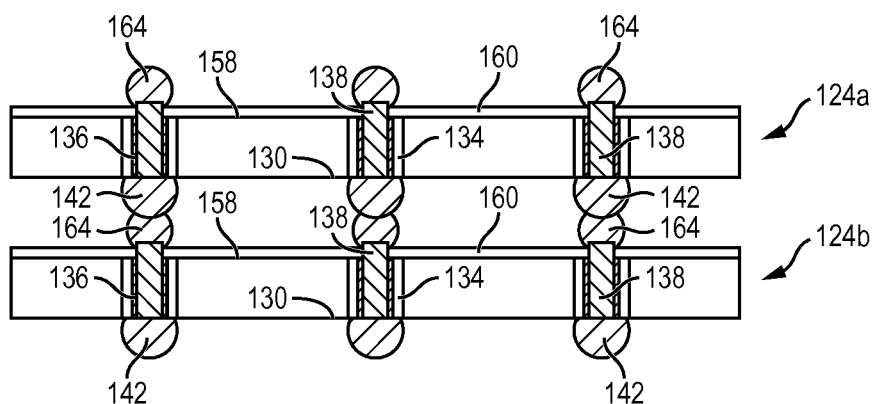
FIG. 5 illustrates two stacked semiconductor die with the UBM structure formed on a back surface of the die.

FIG. 5 shows two stacked semiconductor die 124 electrically connected through conductive TSV 138, bumps 142 and bumps 164. The circuits on active surface 130 of semiconductor die 124a are electrically connected through conductive TSV 138, bumps 142 and bumps 164 to the circuits on active surface 130 of semiconductor die 124b.

Figure 6A:
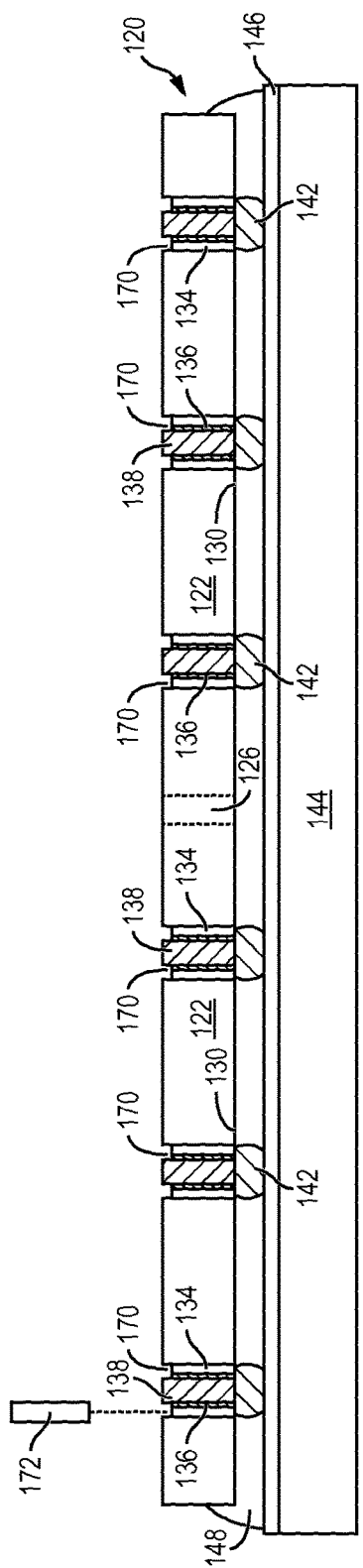
Figure 6B:
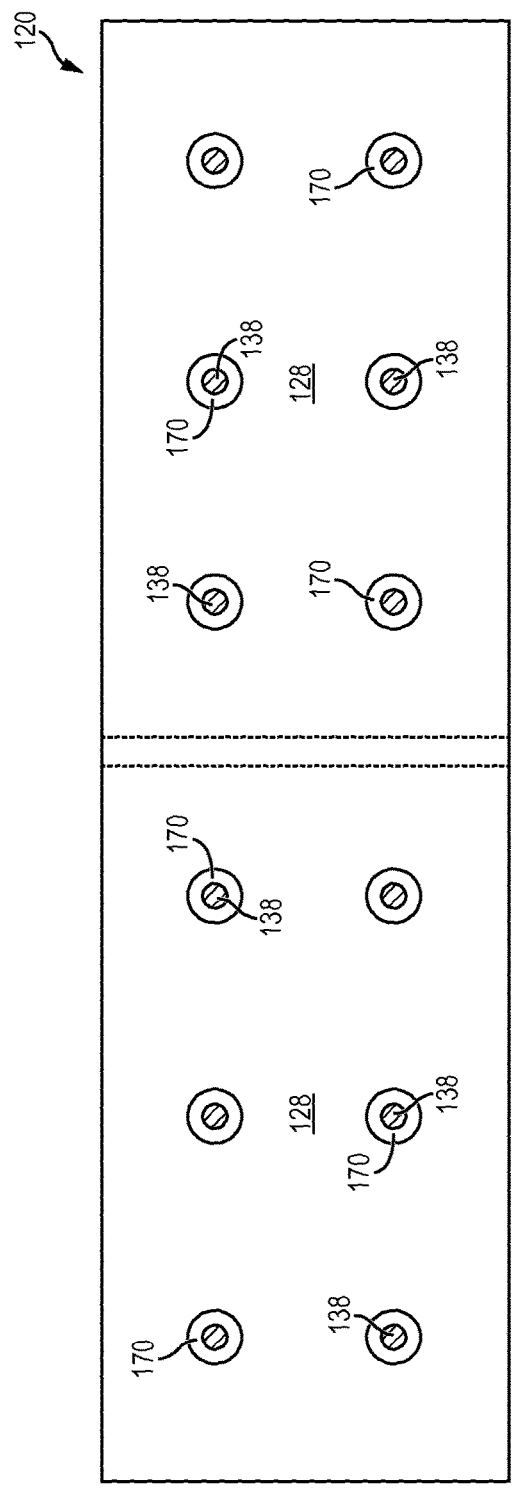

In another embodiment continuing from FIG. 3i, a portion of insulating layer 134 and conductive layer 136 around conductive TSV 138 is removed by an etching process through a patterned photoresist layer to form recesses 170 into base substrate material 122, as shown in FIG. 6a. Alternatively, recesses 170 are formed by LDA using laser 172. In one embodiment, the depth of recesses 170 is 1-20 µm. FIG. 6b shows a plan view of back surface 128 of semiconductor die 124 and recesses 170 formed around conductive TSV 138.

Figure 6C:
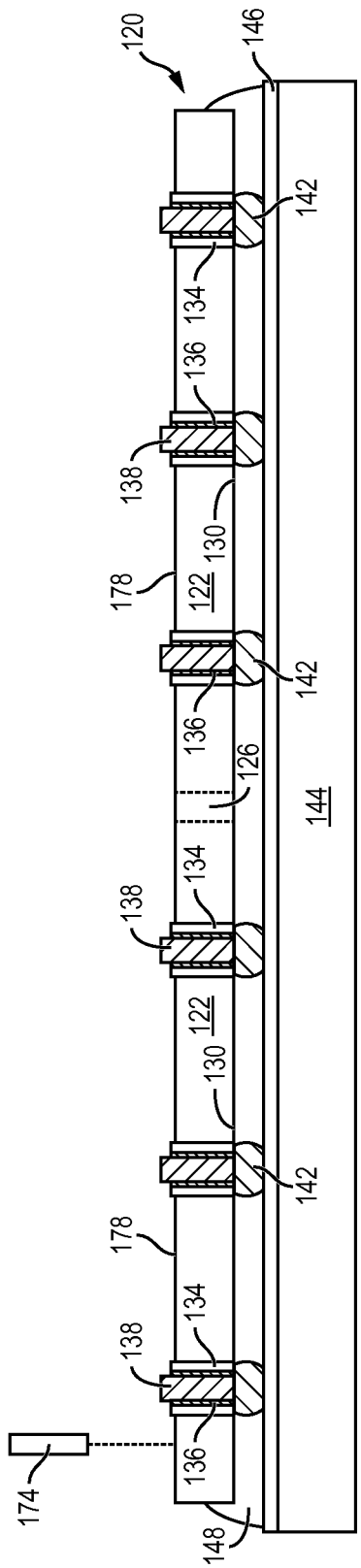

After forming recesses 170, a portion of back surface 128 of semiconductor wafer 120 is removed by an etching process through a patterned photoresist layer, as shown in FIG. 6c. Alternatively, a portion of back surface 128 of semiconductor wafer 120 is removed by LDA using laser 174. The amount of base substrate material 122 removed is greater than the depth of recesses 170. Accordingly, insulating layer 134 and conductive layer 136 extend above surface 178 of semiconductor wafer 120. Forming recesses 170 prior to removing a portion of back surface 128 allows for process control and precision during removal of insulating layer 134 and reduces cracking of the insulating layer due to thermal stress. After removing a portion of back surface 128, conductive TSV 138 extends above surface 178 of semiconductor wafer 120.

Figure 6D:
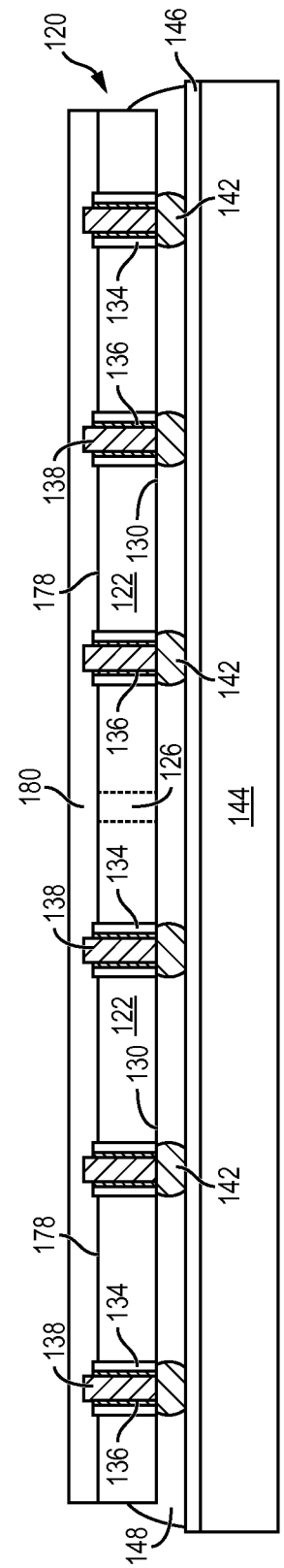

In FIG. 6d, an insulating or dielectric layer 180 is blanket formed over surface 178 of semiconductor wafer 120, insulating layer 134, conductive layer 136, and conductive TSV 138 using PVD, CVD, printing, spin coating, or spray coating. The insulating layer 180 contains one or more layers of SiO2, Si3N4, SiON, Ta2O5, Al2O3, HfO2, PI, BCB, PBO, or other material having similar dielectric properties.

In FIG. 6e, a portion of insulating layer 180 is removed by an etching process to expose an upper surface and a portion of sidewalls of conductive TSV 138, while leaving a layer of insulating layer 180 over surface 178 of semiconductor wafer 120, insulating layer 134, and conductive layer 136. In another embodiment, a portion of insulating layer 180 is removed by LDA using laser 182 to expose an upper surface and a portion of sidewalls of conductive TSV 138, while leaving a layer of insulating layer 180 over surface 178 of semiconductor wafer 120, insulating layer 134, and conductive layer 136. FIG. 6f shows a plan view of the exposed and extended conductive TSV 138 surrounded by insulating layer 180.

In FIG. 6g, an electrically conductive bump material is deposited over the exposed conductive TSV 138 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive TSV 138 using a suitable attachment or bonding process. In one embodiment, the bump material is reflowed by heating the material above its melting point to form balls or bumps 184. In some applications, bumps 184 are reflowed a second time to improve electrical contact to conductive TSV 138. Bumps 184 can also be compression bonded to conductive TSV 138. Bumps 184 represent one type of interconnect structure that can be formed over conductive TSV 138. The interconnect structure can also use stud bump, micro bump, or other electrical interconnect.

FIG. 6h shows further detail of insulating layer 134, conductive layer 136, conductive TSV 138, and insulating layer 180 in block 186 defined in FIG. 6g. In particular, insulating layer 134 extends above surface 178, but remains below surface 183 of insulating layer 180. The exposed and extended conductive TSV 138 operates as a UBM structure formed on a back surface of semiconductor wafer 120. In one embodiment, bumps 184 are formed by electroless plating to an upper surface and side surfaces of conductive TSV 138 exposed and extending from insulating layer 180.

Semiconductor wafer 120 is singulated through insulating layer 180, saw street 126, and MUF material 148 using a saw blade or laser cutting tool 188 into individual semiconductor die 124. Carrier 144 and interface layer 146 are removed by chemical etching, mechanical peeling, CMP, mechanical grinding, thermal bake, UV light, laser scanning, or wet stripping to expose bumps 142.

FIG. 7 shows semiconductor die 124 after singulation. The circuits on active surface 130 of semiconductor die 124 are electrically connected to conductive TSV 138, bumps 142 and bumps 184. A portion of insulating layer 134 and conductive layer 136 around conductive TSV 138 is removed to form recesses 170 into back surface 128 of semiconductor wafer 120. After forming recesses 170, a portion of back surface 128 is removed so that conductive TSV 138 extends above surface 178. Forming recesses 170 prior to removing a portion of back surface 128 allows for process control and precision during removal of insulating layer 134 and reduces cracking of the insulating layer due to thermal stress. An insulating layer 180 is blanket formed over surface 178 of semiconductor wafer 120, insulating layer 134, conductive layer 136, and conductive TSV 138. A portion of insulating layer 180 is removed to expose an upper surface and a portion of the sidewalls of conductive TSV 138, while leaving a layer of insulating layer 180 over surface 178 of semiconductor wafer 120, insulating layer 134, and conductive layer 136. The remaining portion of insulating layer 134 extends above surface 178, but remains below surface 183 of insulating layer 180. Bumps 184 are formed over the exposed and extended conductive TSV 138 by electroless plating. No masking layer is required for electroless plating of bumps 184 over the exposed and extended conductive TSV 138. The extended conductive TSV 138 provides greater contact area with bumps 184, namely contact with the exposed upper surface and sidewalls of the conductive TSV for a high reliability interconnect.

Figure 8A:
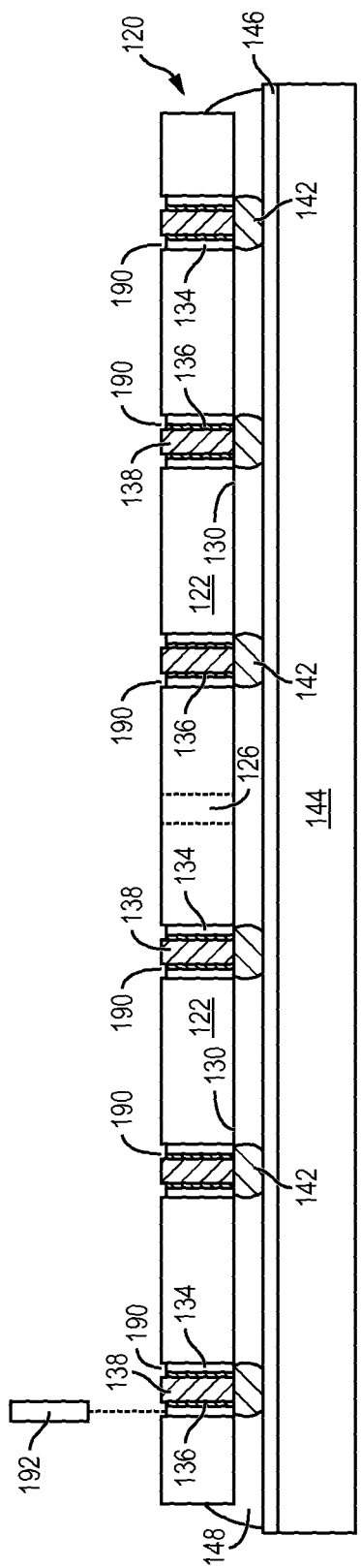
Figure 8B:
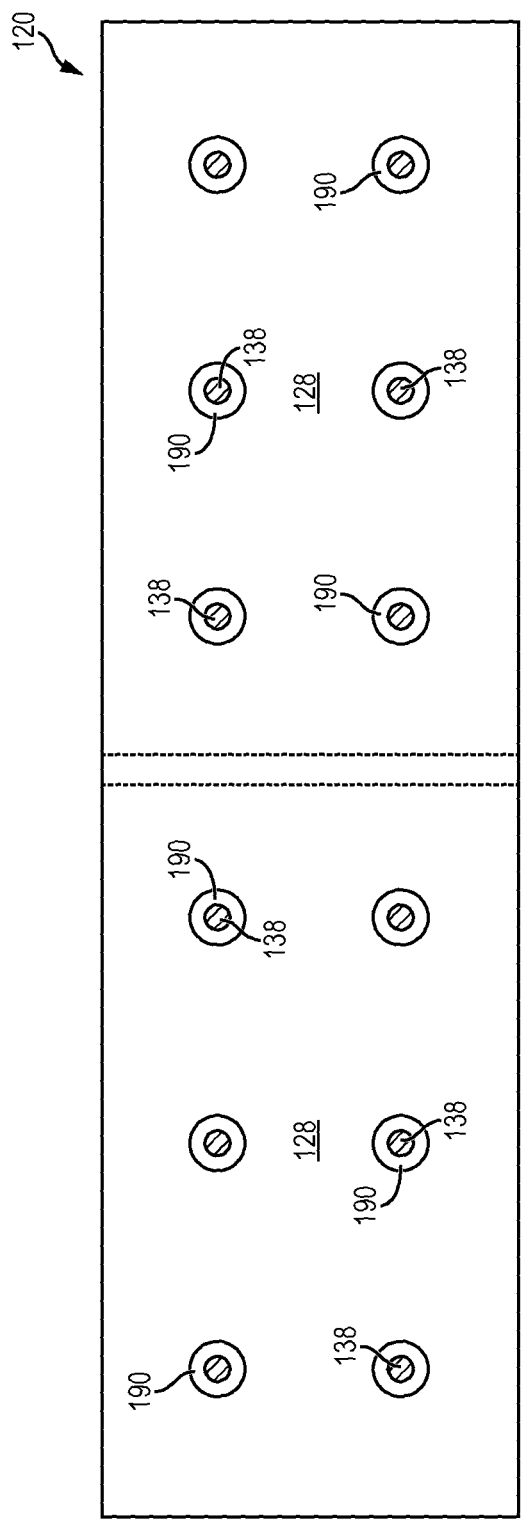

In another embodiment continuing from FIG. 3i, a portion of insulating layer 134 and conductive layer 136 around conductive TSV 138 is removed by an etching process through a patterned photoresist layer to form recesses 190 into base substrate material 122, as shown in FIG. 8a. Alternatively, recesses 190 are formed by LDA using laser 192. In one embodiment, the depth of recesses 190 is 1-20 µm. FIG. 8b shows a plan view of back surface 128 of semiconductor die 124 and recesses 190 formed around conductive TSV 138.

After forming recesses 190, a portion of back surface 128 of semiconductor wafer 120 is removed by an etching process through a patterned photoresist layer, as shown in FIG. 8c. Alternatively, a portion of back surface 128 of semiconductor wafer 120 is removed by LDA using laser 194. The amount of base substrate material 122 removed is greater than the depth of recesses 190. Forming recesses 190 prior to removing a portion of back surface 128 allows for process control and precision during removal of insulating layer 134 and reduces cracking of the insulating layer due to thermal stress. After removing a portion of back surface 128, conductive TSV 138 extends above surface 198 of semiconductor wafer 120.

In FIG. 8d, an insulating or dielectric layer 200 is blanket formed over surface 198 of semiconductor wafer 120, insulating layer 134, conductive layer 136, and conductive TSV 138 using PVD, CVD, printing, spin coating, or spray coating. The insulating layer 200 contains one or more layers of SiO2, Si3N4, SiON, Ta2O5, Al2O3, HfO2, PI, BCB, PBO, or other material having similar dielectric properties.

Figure 8E:
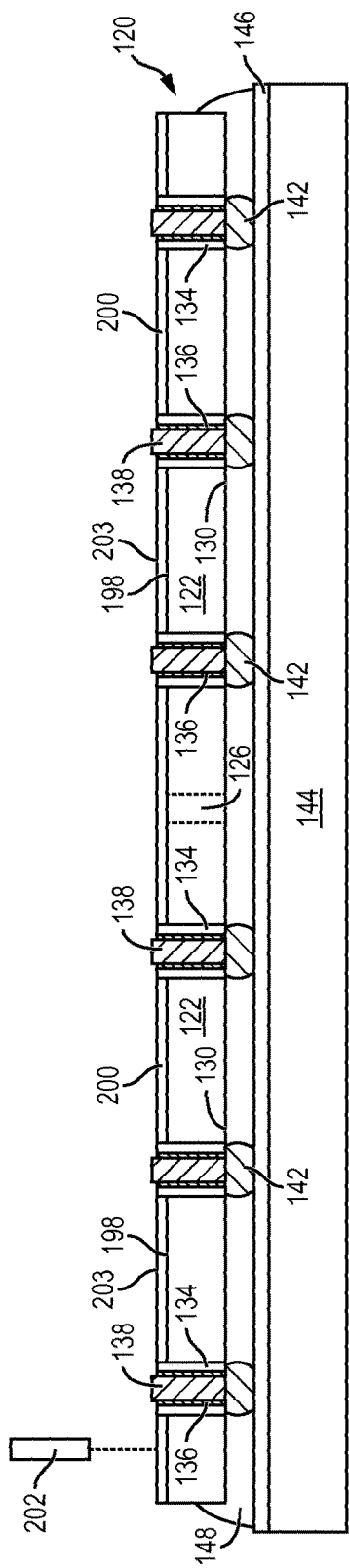
Figure 8F:
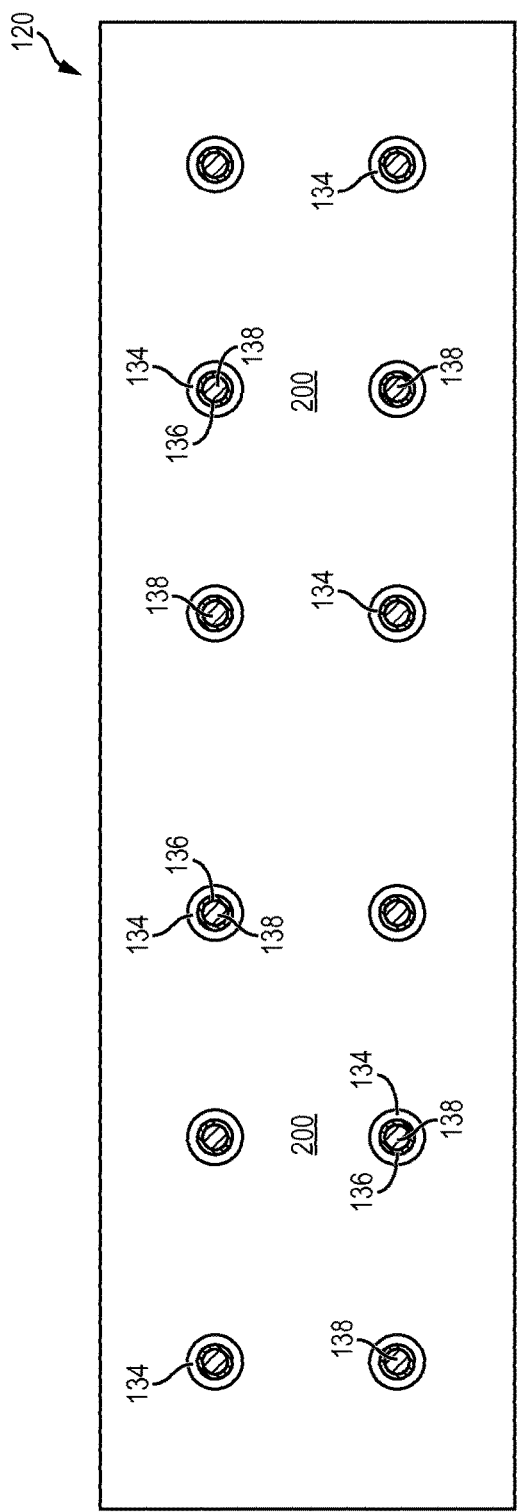

In FIG. 8e, a portion of insulating layer 200 is removed by an etching process to expose an upper surface and a portion of sidewalls of conductive TSV 138, while leaving a layer of insulating layer 200 over surface 198 of semiconductor wafer 120, insulating layer 134, and conductive layer 136. In another embodiment, a portion of insulating layer 200 is removed by LDA using laser 202 to expose an upper surface and a portion of sidewalls of conductive TSV 138, while leaving a layer of insulating layer 200 over surface 198 of semiconductor wafer 120, insulating layer 134, and conductive layer 136. The remaining portion of insulating layer 134 extends to surface 203 of insulating layer 200. FIG. 8f shows a plan view of the exposed and extended conductive TSV 138 and insulating layers 134 and 180 and conductive layer 136.

Figure 8G:
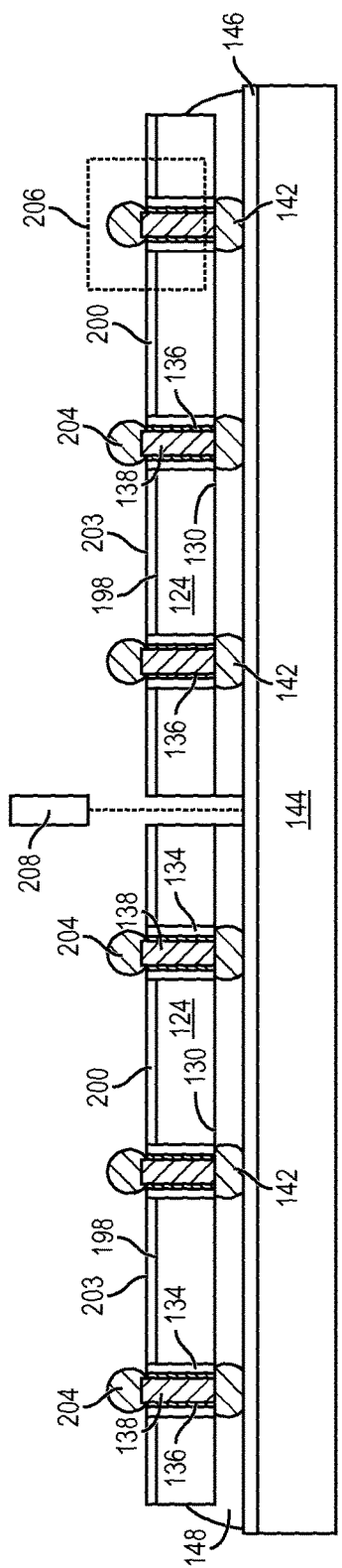

In FIG. 8g, an electrically conductive bump material is deposited over the exposed conductive TSV 138 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive TSV 138 using a suitable attachment or bonding process. In one embodiment, the bump material is reflowed by heating the material above its melting point to form balls or bumps 204. In some applications, bumps 204 are reflowed a second time to improve electrical contact to conductive TSV 138. Bumps 204 can also be compression bonded to conductive TSV 138. Bumps 204 represent one type of interconnect structure that can be formed over conductive TSV 138. The interconnect structure can also use stud bump, micro bump, or other electrical interconnect.

Figure 8H:
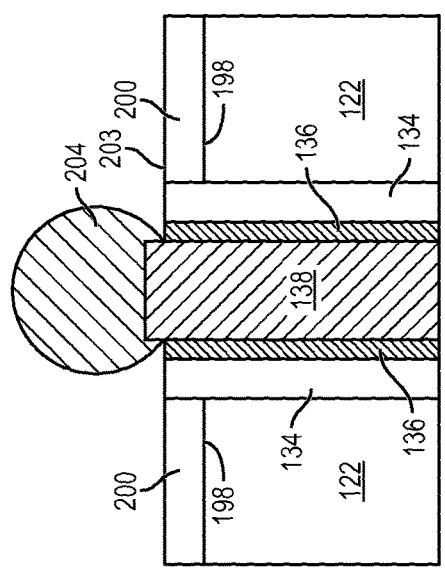

FIG. 8h shows further detail of insulating layer 134, conductive TSV 138, and insulating layer 200 in block 206 defined in FIG. 8g. In particular, insulating layer 134 extends to surface 198 of semiconductor wafer 120. The exposed and extended conductive TSV 138 operates as a UBM structure formed on a back surface of semiconductor wafer 120.

Semiconductor wafer 120 is singulated through insulating layer 200, saw street 126, and MUF material 148 using a saw blade or laser cutting tool 208 into individual semiconductor die 124. Carrier 144 and interface layer 146 are removed by chemical etching, mechanical peeling, CMP, mechanical grinding, thermal bake, UV light, laser scanning, or wet stripping to expose bumps 142. In one embodiment, bumps 204 are formed by electroless plating to an upper surface and side surfaces of conductive TSV 138 exposed and extending from insulating layer 200.

Figure 9:
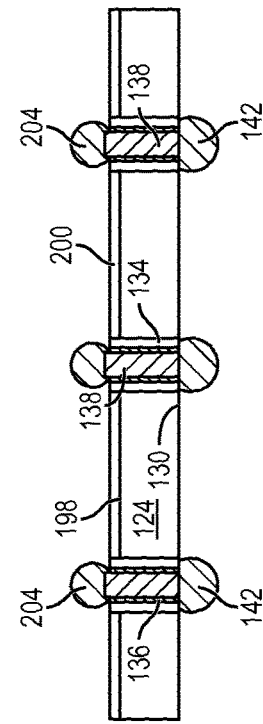
FIG. 9 illustrates a semiconductor die with the UBM structure formed on a back surface of the die according to FIGS. 8a-8h.

FIG. 9 shows semiconductor die 124 after singulation. The circuits on active surface 130 of semiconductor die 124 are electrically connected to conductive TSV 138, bumps 142 and bumps 204. A portion of insulating layer 134 and conductive layer 136 around conductive TSV 138 is removed to form recesses 190 into back surface 128 of semiconductor wafer 120. After forming recesses 150, a portion of back surface 128 is removed so that conductive TSV 138 extends above surface 198. Removing a portion of insulating layer 134 prior to removing a portion of back surface 128 provides process control and precision during removal of insulating layer 134 and reduces cracking of the insulating layer due to thermal stress. The remaining portion of insulating layer 134 extends to surface 198 of semiconductor wafer 120. An insulating layer 200 is blanket formed over surface 198 of semiconductor wafer 120, insulating layer 134, and conductive TSV 138. A portion of insulating layer 200 is removed to expose an upper surface and a portion of the sidewalls of conductive TSV 138, while leaving a layer of insulating layer 200 over surface 198 of semiconductor wafer 120. Bumps 204 are formed over the exposed and extended conductive TSV 138 by electroless plating. No masking layer is required for electroless plating of bumps 204 over the exposed and extended conductive TSV 138. The extended conductive TSV 138 provides greater contact area with bumps 204, namely on the exposed upper surface and sidewalls of the conductive TSV for a high reliability interconnect.

In summary, a plurality of vias 133 is formed through semiconductor wafer 120. The insulating layer 134 is formed over sidewalls of vias 133. Conductive material is deposited over insulating layer 134 in vias 133 to form conductive vias 138. Recesses 150 are formed in insulating layer 134 and conductive layer 136 around conductive vias 138. A portion of semiconductor wafer 120 is removed after forming recesses 150 in insulating layer 134 so that conductive vias 138 extend above surface 158 of semiconductor wafer 120. Removing the portion of semiconductor wafer 120 after forming recesses 150 in insulating layer 134 reduces cracking of the insulating layer. The insulating layer 134 extends to surface 158 of semiconductor wafer 120, or above surface 158 of semiconductor wafer 120. The insulating layer 160 is formed over surface 158 of semiconductor wafer 120 and conductive vias 138. A portion of insulating layer 160 is removed while leaving a second portion of insulating layer 160 over surface 158 of semiconductor wafer 120 around conductive vias 138. Bumps 164 are formed over conductive vias 138 by electroless plating.

While one or more embodiments of the present invention have been illustrated in detail, the skilled artisan will appreciate that modifications and adaptations to those embodiments may be made without departing from the scope of the present invention as set forth in the following claims.

What is claimed:

1. A semiconductor device, comprising:
   a semiconductor die;
   a conductive via formed through the semiconductor die;
   a first insulating layer formed around the conductive via and extending beyond a first surface of the semiconductor die;
   a second insulating layer formed in direct contact with the first surface of the semiconductor die and extending over a portion of the first insulating layer which extends beyond the first surface of the semiconductor die to contact the conductive via, wherein a first end of the conductive via extends beyond the first insulating layer and second insulating layer, and the second insulating layer includes a first thickness over the portion of the first insulating layer and a second thickness greater than the first thickness over the first surface of the semiconductor die; and
   a first bump formed in contact with the first end of the conductive via and a side surface of the conductive via.

2. The semiconductor device of claim 1, further including a conductive layer formed between the first insulating layer and conductive via.

3. The semiconductor device of claim 1, further including an underfill material formed over a second surface of the semiconductor die opposite the first surface of the semiconductor die.

4. The semiconductor device of claim 1, wherein the first surface of the semiconductor die is a non-active surface of the semiconductor die.

5. The semiconductor device of claim 1, further including a second bump formed over a second end of the conductive via opposite the first end of the conductive via.

6. The semiconductor device of claim 1, further including a plurality of stacked semiconductor die electrically connected through the conductive via.

7. A semiconductor device, comprising:
   a substrate;
   a conductive via formed through the substrate;
   a first insulating layer formed around the conductive via;
   a second insulating layer formed over a first surface of the substrate and extending over the first insulating layer to contact the conductive via, wherein a first end of the conductive via extends beyond the first insulating layer and second insulating layer, and the second insulating layer includes a first thickness over the first insulating layer and a second thickness greater than the first thickness over the first surface of the substrate; and
   a first bump formed in contact with the first end of the conductive via.

8. The semiconductor device of claim 7, further including a conductive layer formed between the first insulating layer and conductive via.

9. The semiconductor device of claim 7, further including an underfill material formed over a second surface of the substrate opposite the first surface of the substrate.

10. The semiconductor device of claim 7, wherein the first surface of the substrate is a non-active surface of the substrate.

11. The semiconductor device of claim 7, further including a second bump formed over a second end of the conductive via opposite the first end of the conductive via.

12. The semiconductor device of claim 7, further including a plurality of stacked substrates electrically connected through the conductive via.

13. A semiconductor device, comprising:
   a substrate;
   a conductive via formed through the substrate;
   a first insulating layer formed around the conductive via;
   a second insulating layer formed over a surface of the substrate and extending over the first insulating layer to the conductive via, wherein the conductive via extends beyond the second insulating layer, and the second insulating layer includes a first thickness over the first insulating layer and a second thickness greater than the first thickness over the surface of the substrate; and
   a first bump formed in contact with the conductive via.

14. The semiconductor device of claim 13, wherein the first insulating layer extends at least to the surface of the substrate.

15. The semiconductor device of claim 13, wherein the first insulating layer extends beyond the surface of the substrate.

16. The semiconductor device of claim 13, further including a conductive layer formed between the first insulating layer and conductive via.

17. The semiconductor device of claim 13, further including a second bump formed over the conductive via opposite the first bump.

18. The semiconductor device of claim 13, further including a plurality of stacked substrates electrically connected through the conductive via.

19. A semiconductor device, comprising:
   a substrate;
   a conductive via formed through the substrate, wherein a first end of the conductive via terminates at a first surface of the substrate and a second end of the conductive via terminates at a second surface of the substrate opposite the first surface; and
   an insulating layer formed around the conductive via, wherein the insulating layer terminates at the first surface of the substrate and terminates below the second surface of the substrate with a recess between the second end of the conductive via and the second surface of the substrate.

20. The semiconductor device of claim 19, further including a conductive layer formed between the insulating layer and conductive via.

21. The semiconductor device of claim 19, further including a bump formed over the first end of the conductive via.

22. The semiconductor device of claim 7, wherein the first insulating layer extends beyond the first surface of the substrate.

* * * * *